United States Patent
Dou et al.

(10) Patent No.: US 10,043,713 B1
(45) Date of Patent: Aug. 7, 2018

(54) METHOD TO REDUCE FINFET SHORT CHANNEL GATE HEIGHT

(71) Applicant: GLOBALFOUNDRIES Inc., Grand Cayman (KY)

(72) Inventors: Xinyuan Dou, Clifton Park, NY (US); Hong Yu, Rexford, NY (US); Zhenyu Hu, Clifton Park, NY (US); Xing Zhang, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/591,814

(22) Filed: May 10, 2017

(51) Int. Cl.
  H01L 21/84 (2006.01)
  H01L 21/8234 (2006.01)
  H01L 27/088 (2006.01)
  H01L 29/10 (2006.01)
  H01L 29/423 (2006.01)

(52) U.S. Cl.
  CPC ........... H01L 21/823456 (2013.01); H01L 21/823412 (2013.01); H01L 21/823431 (2013.01); H01L 27/0886 (2013.01); H01L 29/1033 (2013.01); H01L 29/42376 (2013.01)

(58) Field of Classification Search
  CPC ..... H01L 21/823456; H01L 21/823412; H01L 21/823431; H01L 27/0886; H01L 29/42376; H01L 29/1033; H01L 21/845; H01L 27/0924; H01L 27/1211; H01L 29/66772; H01L 29/66795; H01L 29/7831
  USPC ......... 257/288, 368, 369; 438/151, 197, 199
  See application file for complete search history.

(56) References Cited

U.S. PATENT DOCUMENTS

| | | | |
|---|---|---|---|
| 6,921,711 B2 | 7/2005 | Cabral, Jr. et al. | |
| 8,629,007 B2 | 1/2014 | Haran et al. | |
| 9,293,551 B2 * | 3/2016 | Fan | H01L 27/092 |
| 9,779,997 B2 * | 10/2017 | Li | H01L 27/088 |
| 9,837,351 B1 * | 12/2017 | Chan | H01L 23/5226 |
| 2006/0286748 A1 * | 12/2006 | Hanson | H01L 27/10894 438/257 |
| 2007/0290259 A1 * | 12/2007 | Saino | H01L 21/28035 257/330 |

(Continued)

OTHER PUBLICATIONS

Pan et al., "Selective reactive ion etching of tungsten films in CHF3 and other fluorinated gases", Article in Rensselaer Polytechnic Institute, Center for Integrated Electronics and Department of Electrical, Computer and System Enginerring, Troy, New York, USA, retrieved on Mar. 20, 2017 from "http://www.nanolab.uc.edu/Publications/PDFfiles/111.pdf", 8 pages.

*Primary Examiner* — Shahed Ahmed
(74) *Attorney, Agent, or Firm* — Ditthavong & Steiner, P.C.

(57) ABSTRACT

Methods of reducing the SC GH on a FinFET device while protecting the LC devices and the resulting devices are provided. Embodiments include forming an ILD over a substrate of a FinFET device, the ILD having a SC region and a LC region; forming a SC gate and a LC gate within the SC and LC regions, respectively, an upper surface of the SC and LC gates being substantially coplanar with an upper surface of the ILD; forming a lithography stack over the LC region; recessing the SC gate; stripping the lithography stack; forming a SiN cap layer over the SC and LC regions; forming a TEOS layer over the SiN cap layer; and planarizing the TEOS layer.

9 Claims, 13 Drawing Sheets

(56) References Cited

U.S. PATENT DOCUMENTS

| | | | |
|---|---|---|---|
| 2008/0173929 A1* | 7/2008 | Morikado | H01L 27/105 257/316 |
| 2015/0024584 A1 | 1/2015 | Wells et al. | |
| 2015/0145057 A1* | 5/2015 | Fan | H01L 27/092 257/369 |
| 2015/0263132 A1* | 9/2015 | Liu | H01L 29/66545 438/303 |
| 2015/0371889 A1* | 12/2015 | Kim | H01L 21/3065 438/714 |
| 2016/0049491 A1* | 2/2016 | Lin | H01L 29/4966 257/410 |
| 2016/0380218 A1* | 12/2016 | Afzali-Ardakani | H01L 51/0516 438/157 |
| 2017/0110567 A1* | 4/2017 | Chen | H01L 29/785 |
| 2017/0271434 A1* | 9/2017 | Chou | H01L 28/60 |

* cited by examiner

METHOD TO REDUCE FINFET SHORT CHANNEL GATE HEIGHT

TECHNICAL FIELD

The present disclosure relates to methods of forming a fin field effect transistors (FinFET) device. The present disclosure is particularly applicable to the 14 nanometer (nm) technology node and beyond.

BACKGROUND

A known process for forming short channel (SC) and long channel (LC) devices on a 14 nm FinFET device results in a 28 nm gate height (GH) for both devices post metal gate chemical mechanical polishing (CMP). The resulting margin between the SC fin top work function (WF) metals and gate surface, e.g., 14 nm to 15 nm, is much greater than the margin for the LC devices. It is desirable to reduce the SC GH or margin to reduce the effective capacitance ($C_{eff}$) of the device and, therefore, improve the ring oscillator (RO) performance of the device. However, the LC devices on the FinFET device cannot be further polished without the risk of exposing the LC fin top WF metals due to an extremely limited LC margin and a common CMP dishing issue on long and wide gate areas.

A need therefore exists for methodology enabling a reduction of the SC GH on a FinFET device without exposing the fins of the LC devices and the resulting device.

SUMMARY

An aspect of the present disclosure is a process of reducing the SC GH on a FinFET device while protecting the LC devices.

Another aspect of the present disclosure is a FinFET device having the SC GH lower than the LC GH.

A further aspect of the present disclosure is a FinFET device having the SC GH and region lower than the LC GH and region.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming an interlayer dielectric (ILD) over a substrate of a FinFET device, the ILD having a SC region and a LC region; forming a SC gate and a LC gate within the SC and LC regions, respectively, an upper surface of the SC and LC gates being substantially coplanar with an upper surface of the ILD; forming a lithography stack over the LC region; recessing the SC gate; stripping the lithography stack; forming a silicon nitride (SiN) cap layer over the SC and LC regions; forming a tetraethyl orthosilicate (TEOS) layer over the SiN cap layer; and planarizing the TEOS layer.

Aspects of the present disclosure include forming the ILD of high density plasma (HDP) oxide and low-k spacers. Other aspects include forming the SC and LC gates by: forming a SC trench and a LC trench down to a silicon (Si) fin in the SC and LC regions of the ILD, respectively; forming a conformal dielectric layer in the SC and LC trenches and over the SC and LC regions; forming a conformal WF metal layer over the dielectric layer; forming a conformal barrier metal layer over the WF metal layer; forming a tungsten (W) layer over the barrier metal layer; and planarizing the W, barrier metal, WF metal, and dielectric layers down to the ILD. Further aspects include forming the lithography stack by: forming a spin-on-hardmask (SOH) layer over the LC region; forming a silicon oxynitride (SION) layer over the SOH layer; forming a buried anti-reflective coating (BARC) layer over the SiON layer; and forming a photoresist layer over the BARC layer. Another aspect includes recessing the SC gate by: etching the SC gate selectively to a depth of 8 nm to 10 nm with a dry etchant, forming a cavity. Additional aspects include forming the SiN cap layer on side and bottom surfaces of the cavity. Other aspects include comprising recessing SC region of the ILD at the same time as the SC gate recess. Further aspects include recessing the SC region of ILD by: etching the SC region to a depth of 8 nm to 10 nm with a dry etchant. Another aspect includes planarizing the ILD between the recessed SC region and the LC region subsequent to the stripping of the lithography stack and prior to the forming of the SiN cap layer. Additional aspects include cleaning the SC and LC regions subsequent to the stripping and prior to the forming of the SiN cap layer. Other aspects include forming the SiN cap layer to a thickness of 40 angstrom (Å) to 60 Å.

Another aspect of the present disclosure is a device including: an ILD; a SC gate and a LC gate within the ILD, an upper surface of the SC gate being lower than an upper surface of the LC gate and ILD; a SiN cap layer over the SC and LC gates and ILD and along sidewalls of the ILD above the SC gate; and a planar TEOS layer over the SiN cap layer.

Aspects of the device include the upper surface of the SC gate being 8 nm to 10 nm lower than the upper surface of the LC gate and ILD. Other aspects include the SiN cap layer having a thickness of 40 Å to 60 Å. Further aspects include the ILD being HDP oxide and low-k spacers.

A further aspect of the present device is a device including: an ILD having a SC region and a LC region; a SC gate and a LC gate within the SC and LC regions, respectively, an upper surface of the SC gate and SC region of the ILD being lower than an upper surface of the LC gate and LC region of the ILD; a SiN cap layer over the SC and LC gates and ILD and along a sidewall of the ILD between the SC and LC regions; and a planar TEOS layer over the SiN cap layer.

Aspects of the device include the upper surface of the SC gate and SC region of the ILD being 8 nm to 10 nm lower than the upper surface of the LC gate and LC region of the ILD. Other aspects include a portion of the ILD between the SC and LC regions having a smoothed edge. Further aspects include the SiN cap layer having a thickness of 40 Å to 60 Å. Another aspect includes the ILD being HDP oxide and low-k spacers.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accom- FIGS. 1 through 6 schematically illustrate cross-sectional views of a process flow for forming a FinFET device having the SC GH lower than the LC GH, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of excess margin between the SC fin tip and gate surface attendant upon forming both SC and LC devices on a 14 nm FinFET device and beyond. The problem is solved, inter alia, by forming a FinFET device with the SC GH lower than the LC GH or with the SC GH and region lower than the LC GH and region.

Methodology in accordance with embodiments of the present disclosure includes forming an ILD over a substrate of a FinFET device, the ILD having a SC region and a LC region. A SC gate and a LC gate are formed within the SC and LC regions, respectively, an upper surface of the SC and LC gates being substantially coplanar with an upper surface of the ILD. A lithography stack is formed over the LC region, the SC gate is recessed, and the lithography stack is stripped. A SiN cap layer is formed over the SC and LC regions. A TEOS layer is formed over the SiN cap layer and the TEOS layer is planarized.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
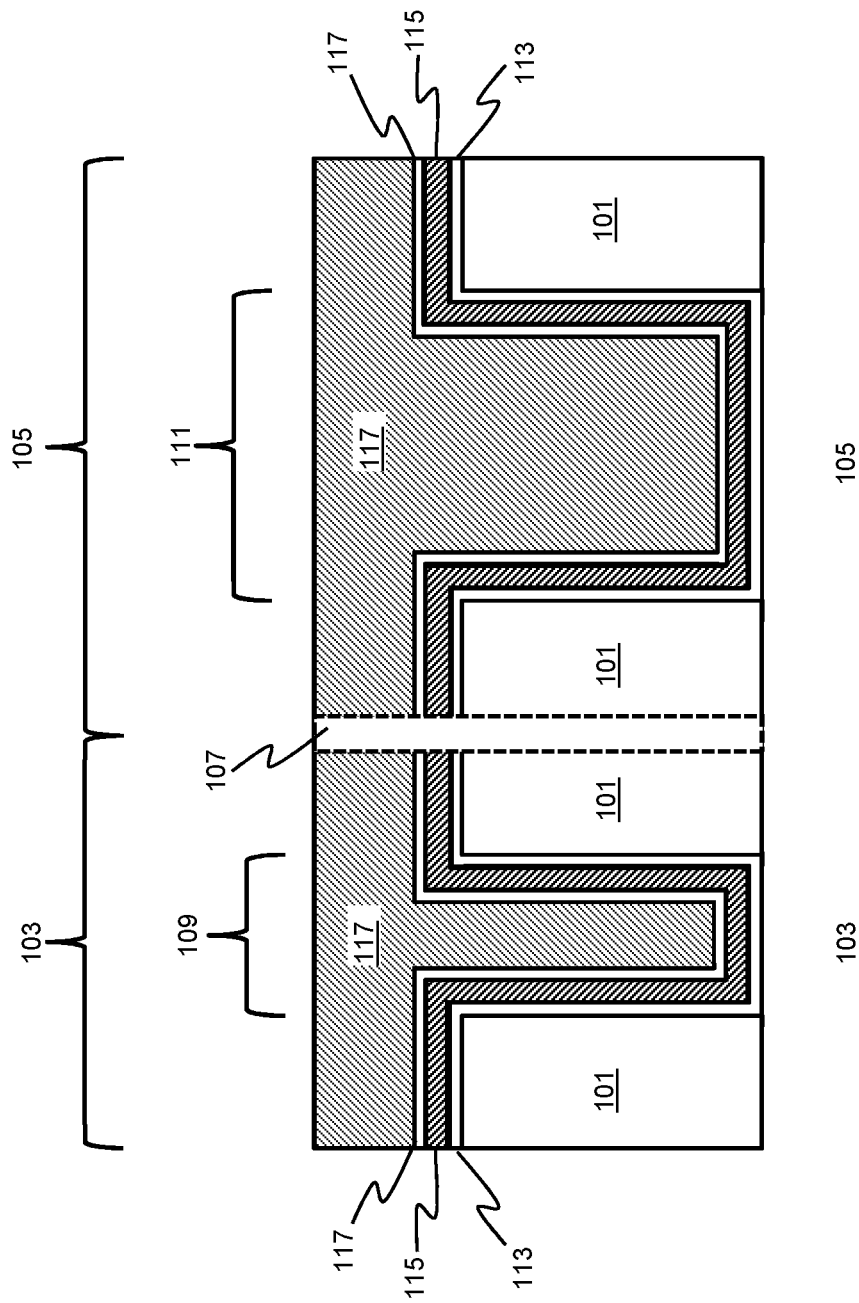
Figure 2:
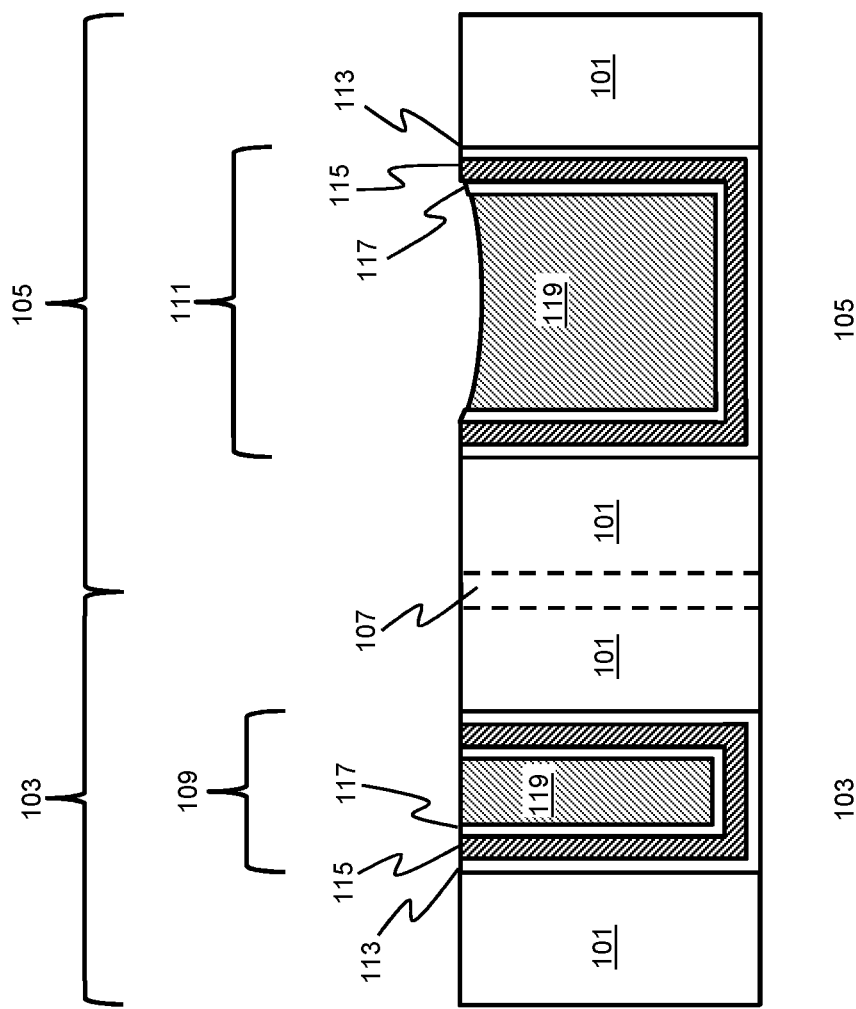

FIGS. 1 through 6 schematically illustrate cross-sectional views of a process flow for forming a FinFET device having the SC GH lower than the LC GH, in accordance with an exemplary embodiment. Adverting to FIG. 1, an ILD 101 is formed, e.g., of HDP oxide and low-k spacers (not shown for illustrative convenience), over a substrate (not shown for illustrative convenience) of a FinFET device. The ILD 101 has a SC region 103 and a LC region 105, as represented by the rectangle 107. A SC gate 109 and a LC gate 111 are subsequently formed in the SC region 103 and LC region 105, respectively. The SC and LC gates 109 and 111, respectively, may be formed, e.g., by forming a SC trench and a LC trench (both not shown for illustrative convenience) through the ILD 101 down to a Si fin (not shown for illustrative convenience) in the SC region 103 and LC region 105, respectively. A conformal dielectric layer 113 is then formed, e.g., of hafnium dioxide ($HfO_2$) and oxide, in the SC and LC trenches and over the SC and LC regions 103 and 105, respectively. Next, a conformal WF metal layer 115 is formed, e.g., of titanium nitride (TiN) and titanium carbide (TiC), over the dielectric layer 113. A conformal barrier metal layer 117 is then formed, e.g., of TiN, over the WF metal layer 115. Thereafter, a W layer 119 is formed over the barrier metal layer 115 and the W, barrier metal, WF metal, and dielectric layers 119, 117, 115, and 113, respectively, are then planarized, e.g., by CMP, down to the ILD 101, as depicted in FIG. 2. At this stage, the upper surface of the SC gate 109 and the LC gate 111 are substantially coplanar and have a GH, e.g., of 28 nm. The GH of the SC and LC gates 109 and 111, respectively, are substantially coplanar rather than absolutely coplanar because the planarization of the W, barrier metal, WF metal, and dielectric layers 119, 117, 115, and 113, respectively, commonly dishes the long and wide gate areas of the device, e.g., to a depth of 6 nm to 9 nm, as discussed above.

Figure 3:
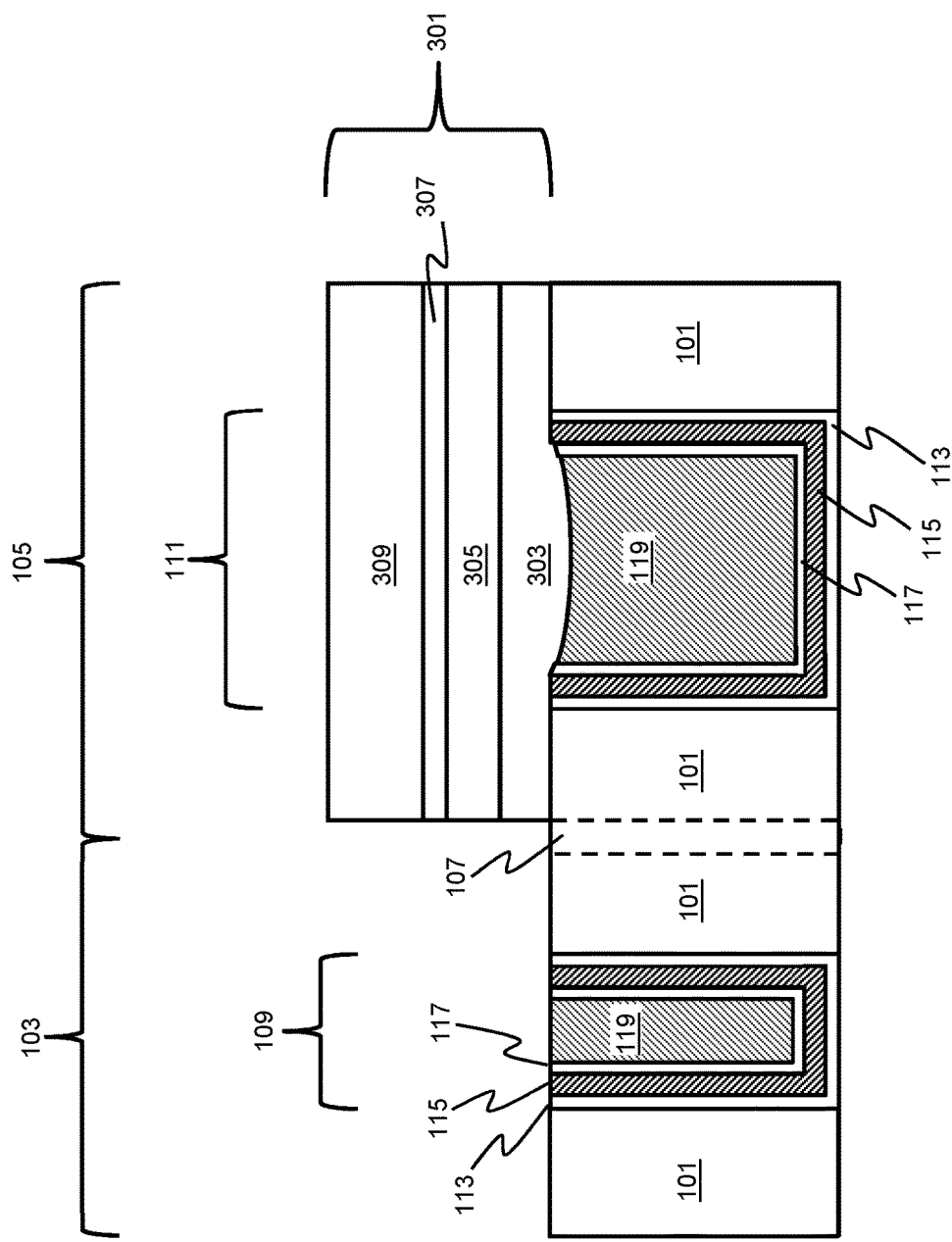
Figure 4:
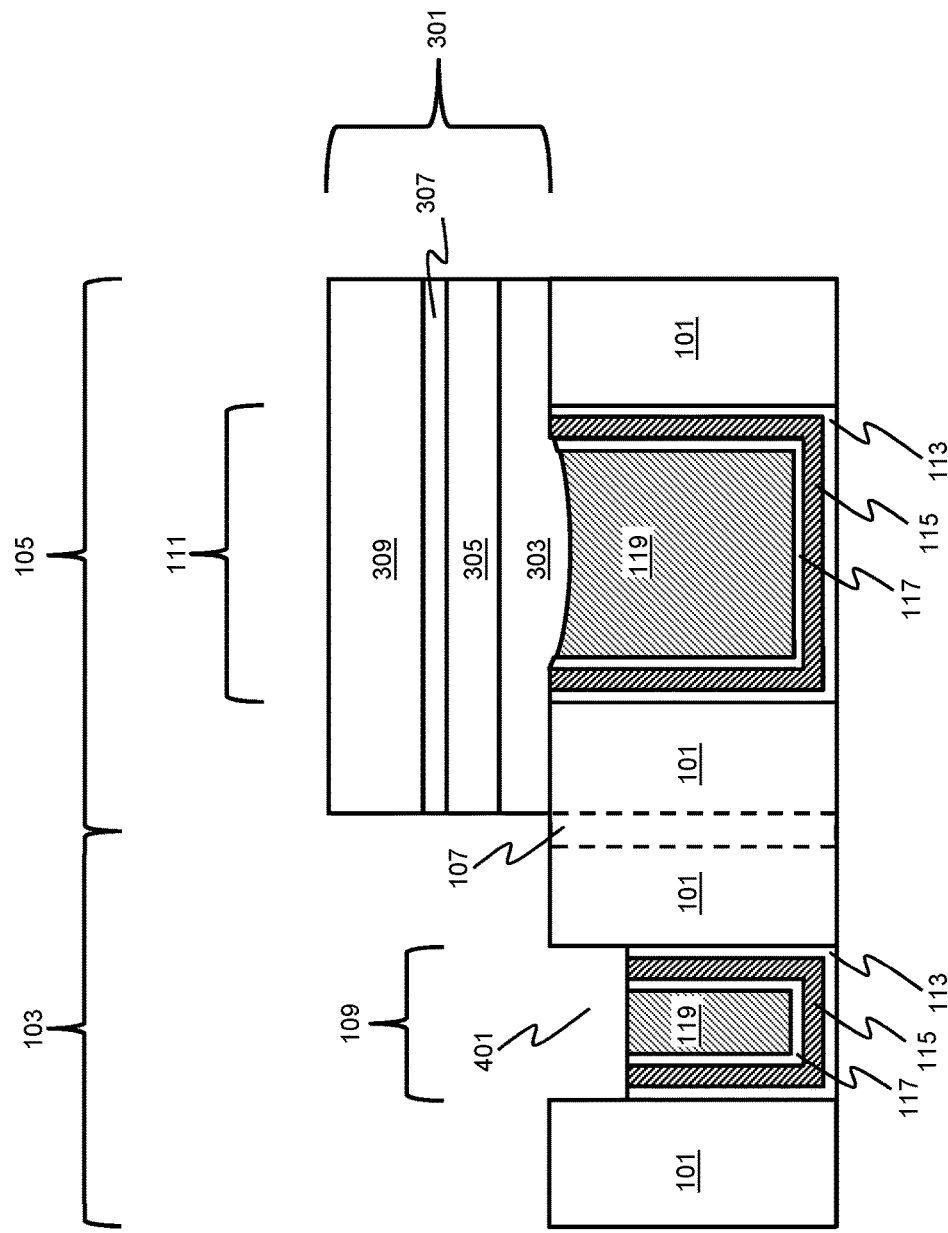

Adverting to FIG. 3, a lithography stack 301 is formed over the LC region 105. The lithography stack 301 may be formed, e.g., of a SOH layer 303, a SION layer 305, a BARC layer 307, and a photoresist layer 309. The SC gate 109 is then selectively etched, e.g., to a depth of 8 nm to 10 nm, with a dry etchant, e.g., nitrogen trifluoride ($NF_3$) and chlorine ($Cl_2$) or fluorinated gases, forming a cavity 401, as depicted in FIG. 4.

Figure 5:
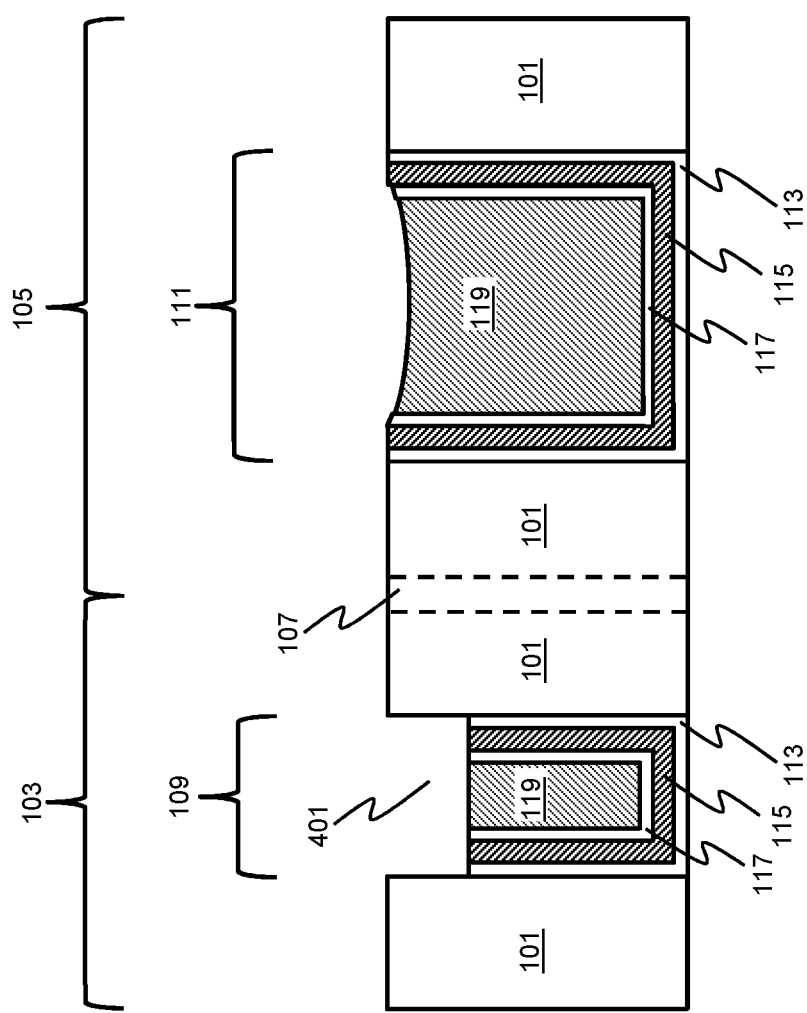
Figure 6:
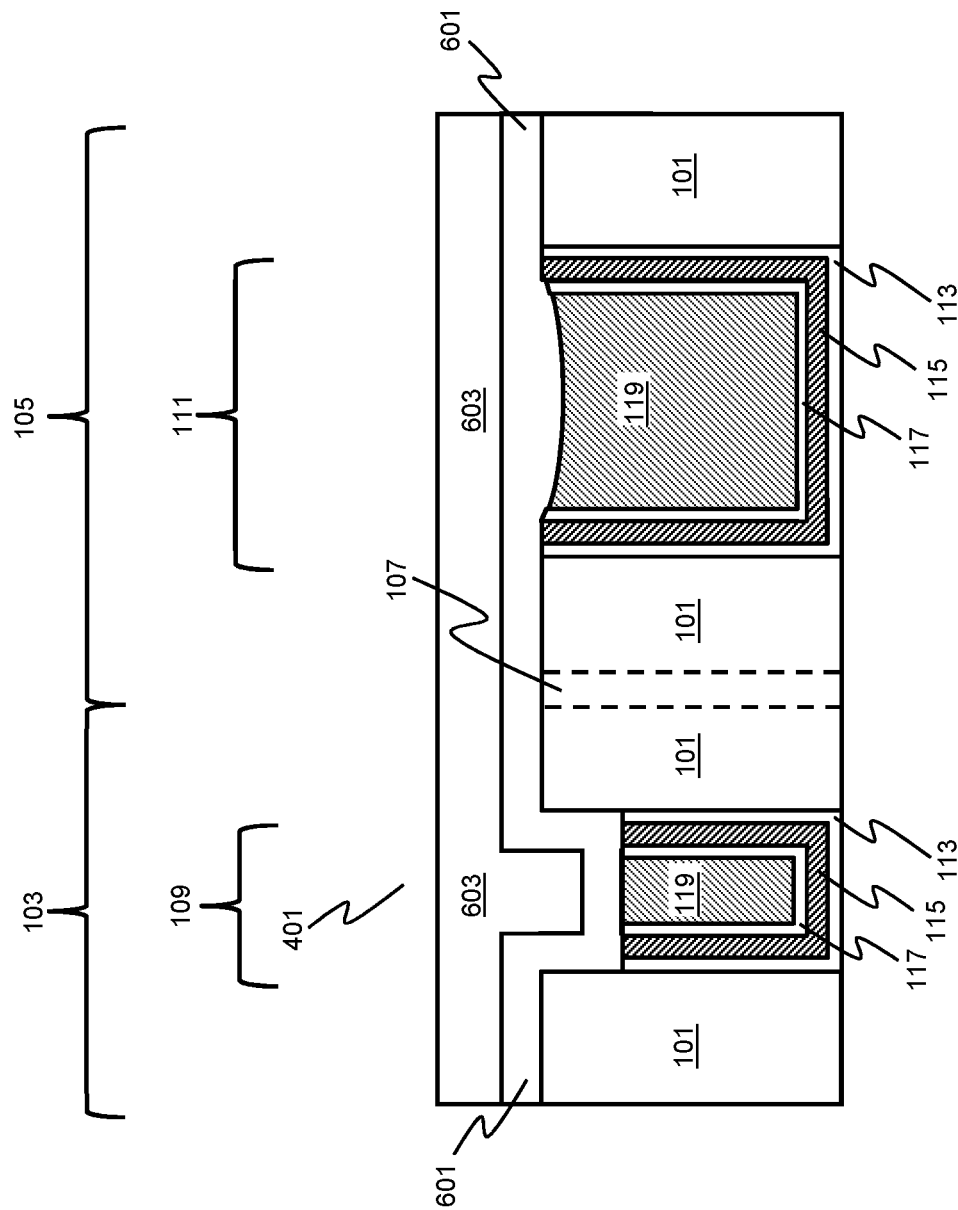

Next, the lithography stack 301 is stripped and the SC and LC regions 103 and 105, respectively, are cleaned (not shown for illustrative convenience), e.g., using an ashing process, a bevel ash, and a dilute sulfuric acid/hydrogen peroxide (DSP) process, as depicted in FIG. 5. Adverting to FIG. 6, a SiN cap layer 601 is formed, e.g., to a thickness of 40 Å to 60 Å, on side and bottom surfaces of the cavity 401 and over the SC and LC regions 103 and 105, respectively. A TEOS layer 603 is then formed over the SiN cap layer 601 and planarized, e.g., by CMP. Consequently, by reducing the GH of the SC gate 109, e.g., by 8 nm to 10 nm, performance sensitivity of the SC gate 109 is increased and the effective capacitance is reduced, thereby improving the SC device RO performance.

Figure 7:
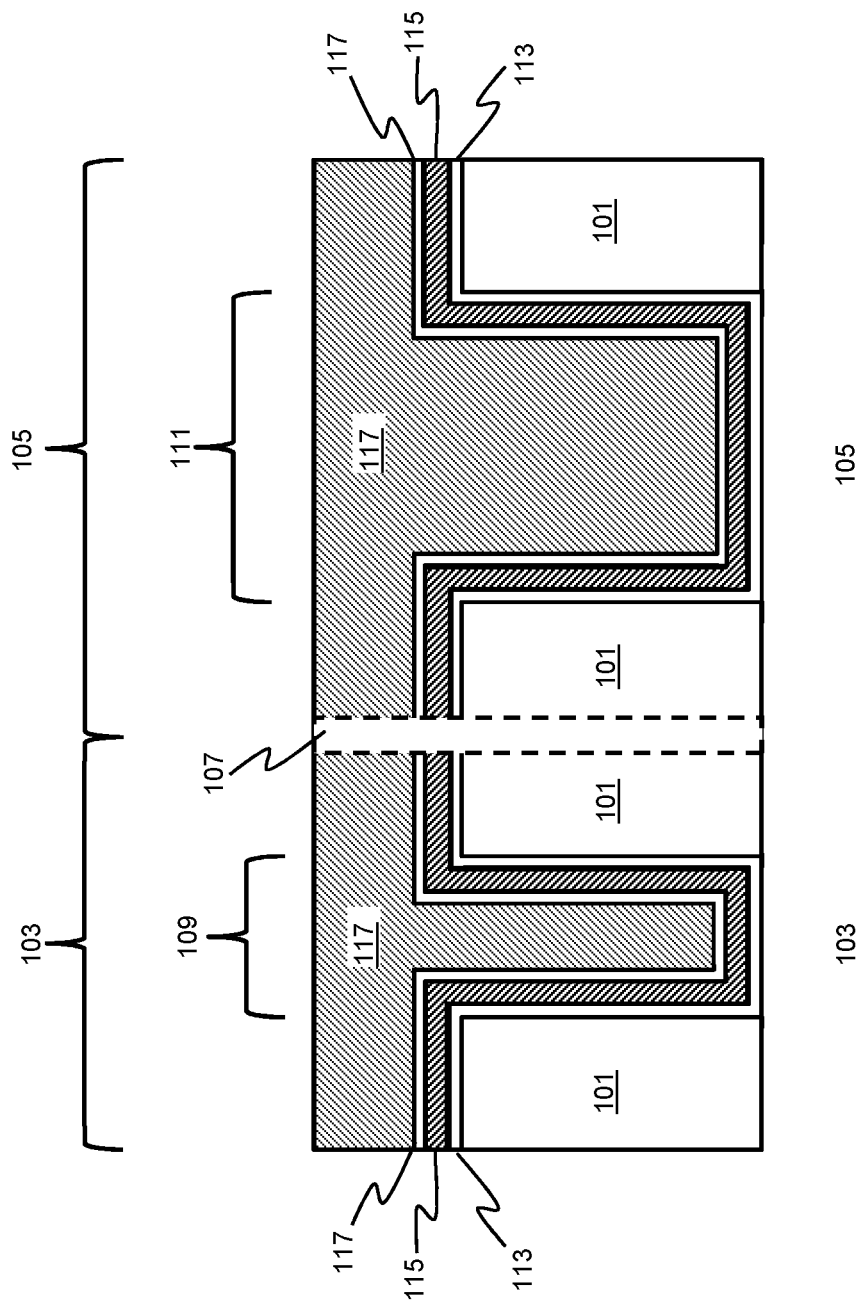
FIGS. 7 through 13 schematically illustrate cross-sectional views of a process flow for forming a FinFET device having the SC GH and region lower than the LC GH and region, in accordance with an exemplary embodiment.
Figure 8:
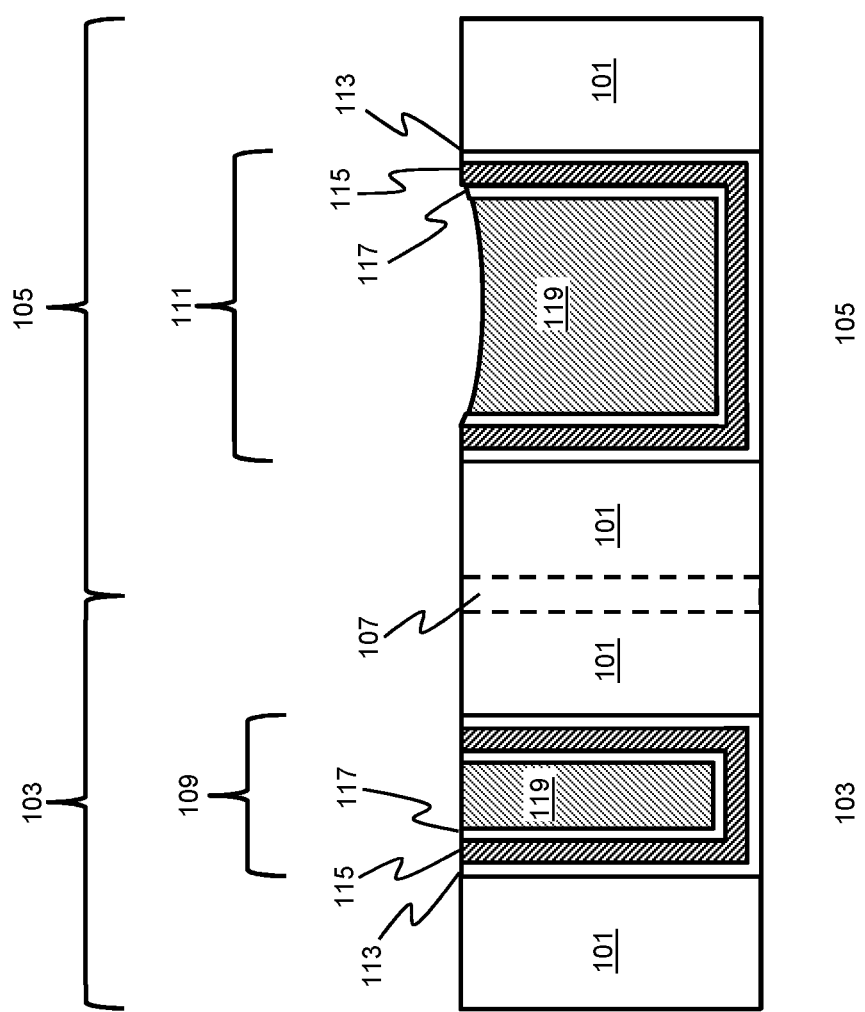
Figure 9:
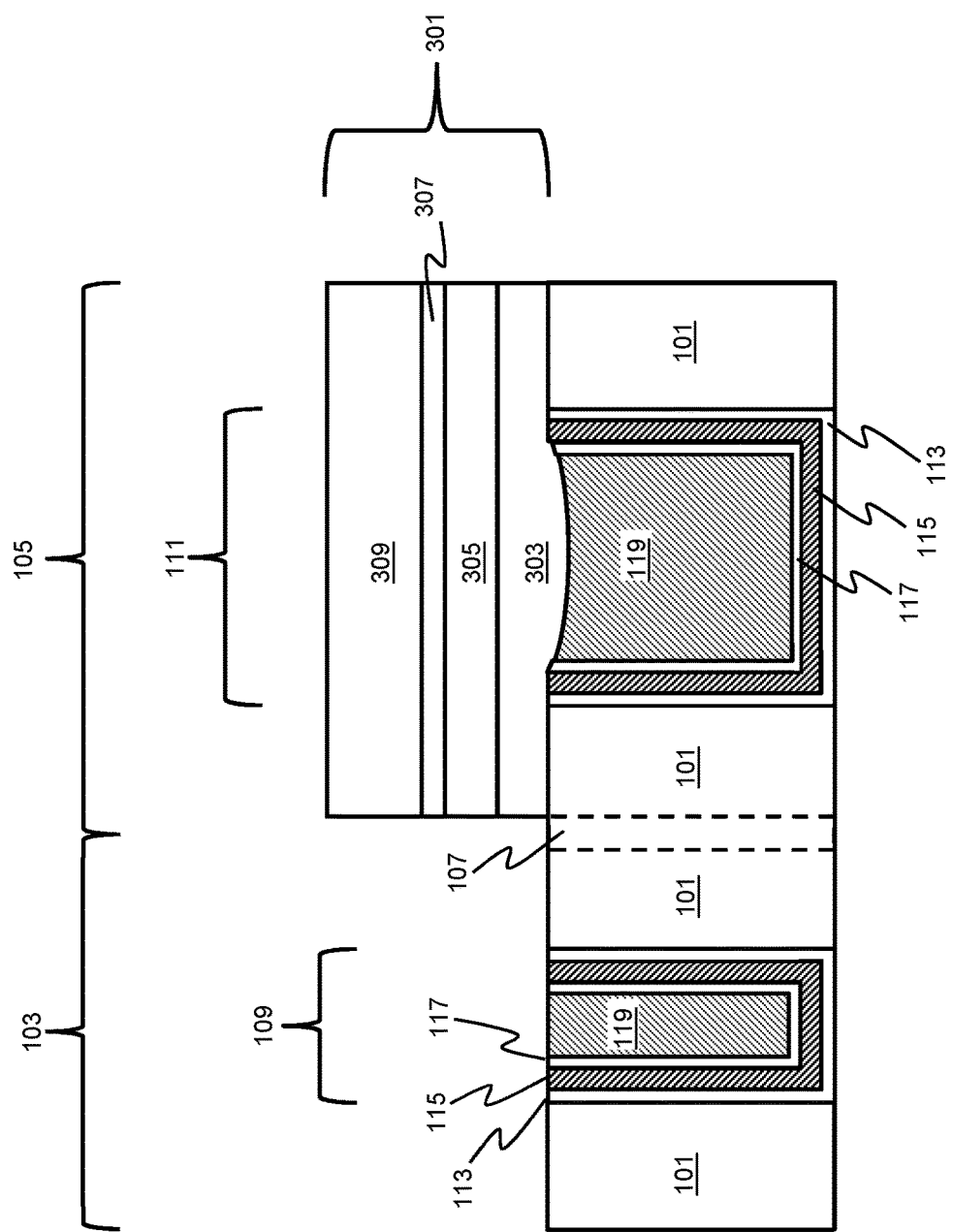
Figure 10:
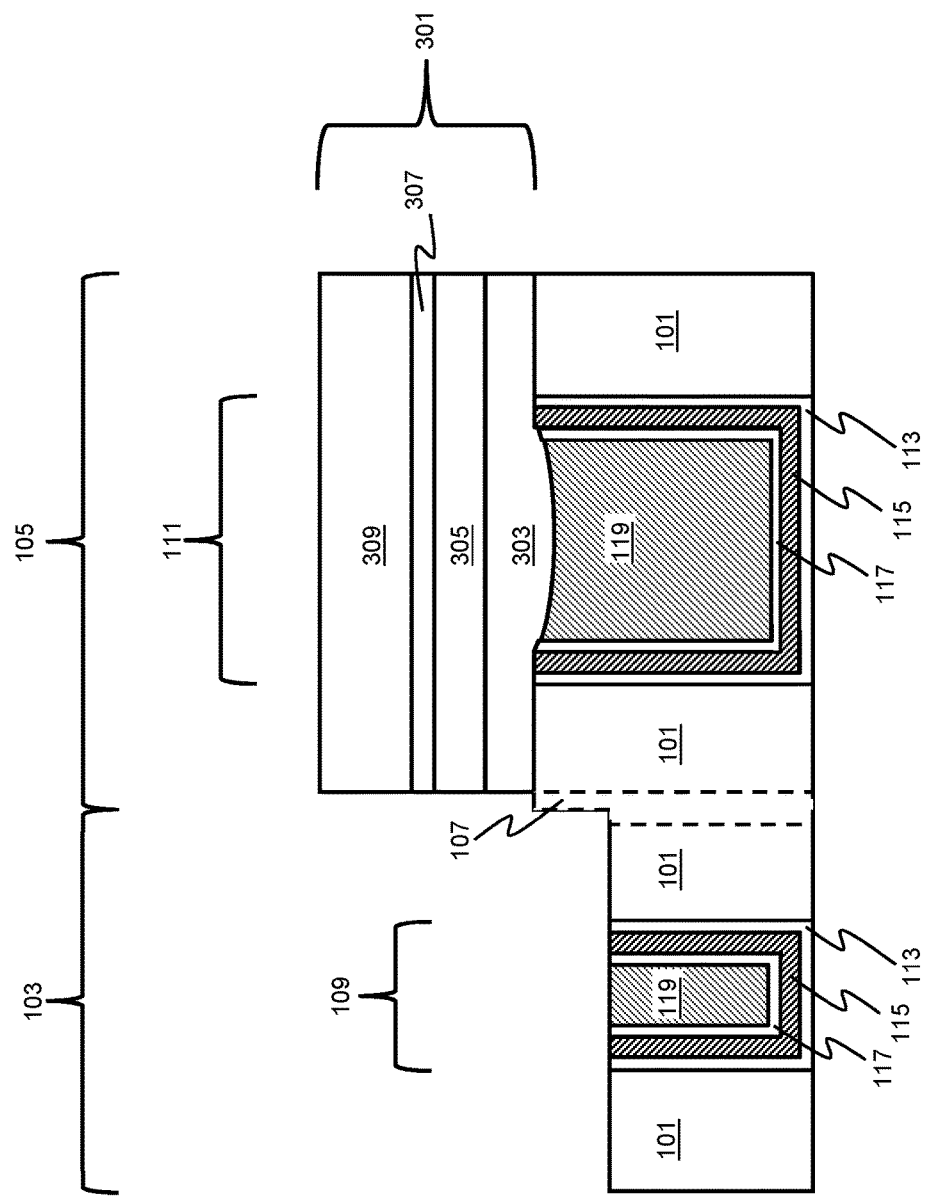
Figure 11:
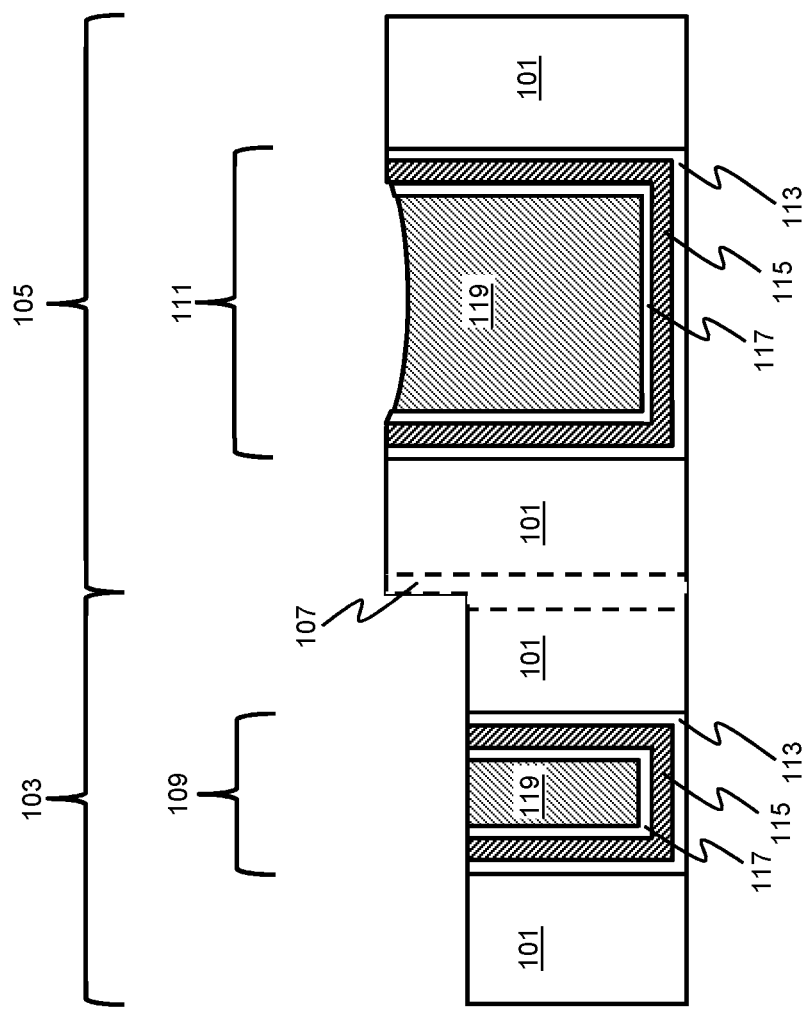

FIGS. 7 through 13 schematically illustrate cross-sectional views of a process flow for forming a FinFET device having the SC GH and region lower than the LC GH and region, in accordance with an exemplary embodiment. The steps of FIGS. 7 through 9 are identical to the steps of FIGS. 1 through 3. Adverting to FIG. 10, after the lithography stack 301 of FIG. 3 is formed over the LC region 105, the SC gate 109 and SC region 103 are both etched at the same time, e.g., to a depth of 8 nm to 10 nm, with a dry etchant, e.g., $NF_3$ and $Cl_2$ or fluorinated gases. The lithography stack 301 is then stripped and the SC and LC regions 103 and 105, respectively, are cleaned (not shown for illustrative convenience), e.g., using an ashing process, a bevel ash, and a DSP process, as depicted in FIG. 11.

Figure 12:
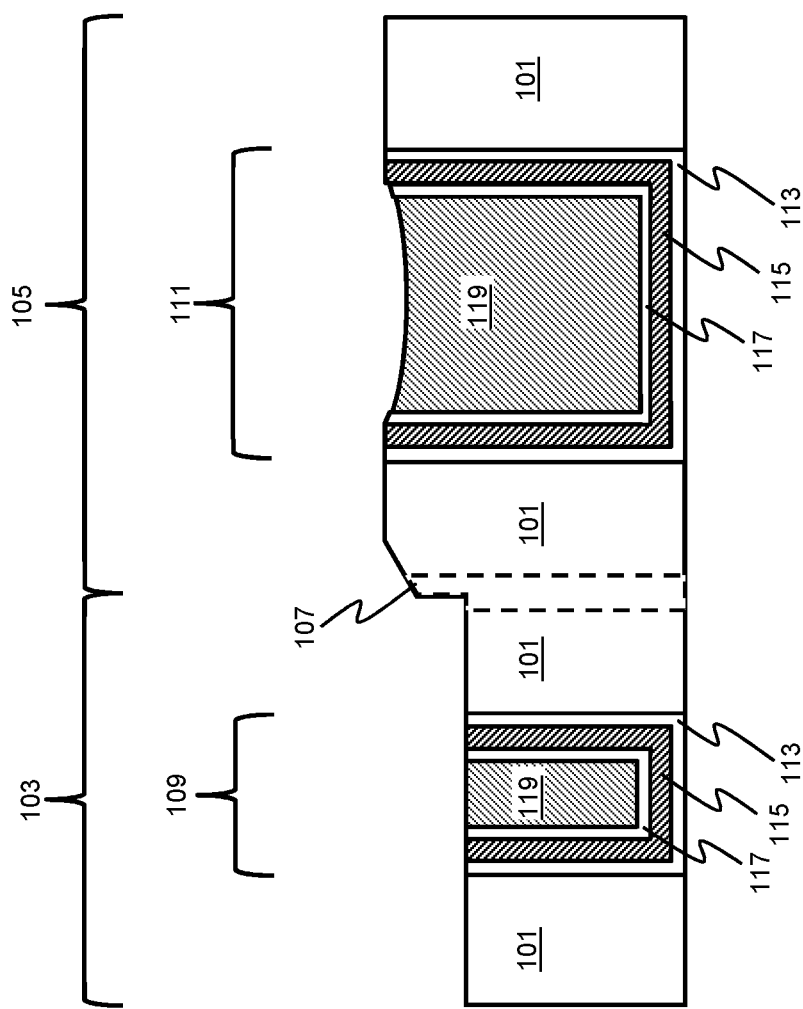
Figure 13:
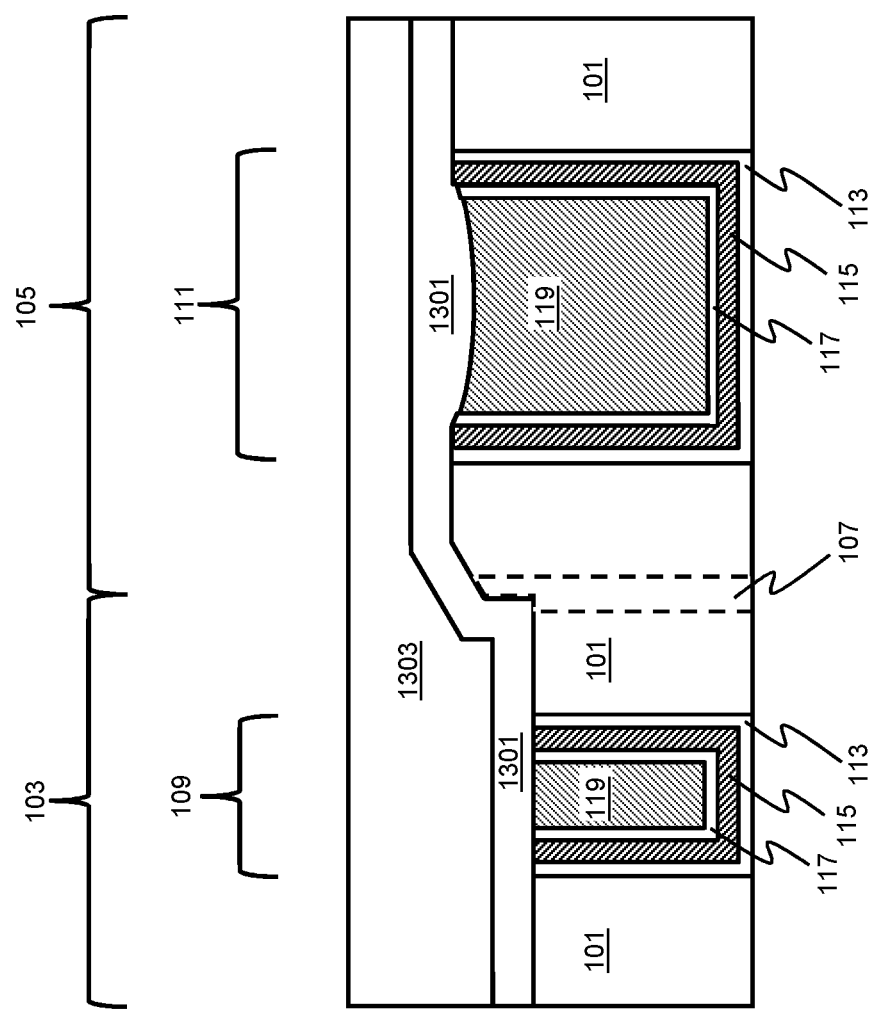

Adverting to FIG. 12, a portion of the ILD 101 between the recessed SC region 103 and the LC region 105 is planarized, e.g., by a minor CMP, to smooth the edge of the ILD 101 between the SC and LC regions 103 and 105, respectively. Similar to FIG. 7, a SiN cap layer 1301 is formed, e.g., to a thickness of 40 Å to 60 Å, over the SC and LC regions 103 and 105, respectively, and a TEOS layer 1303 is formed over the SiN cap layer 1301 and then planarized, e.g., by CMP. Again, by reducing the GH of the SC gate 109, e.g., by 8 nm to 10 nm, performance sensitivity of the SC gate 109 is increased and the effective capacitance is reduced, thereby improving the SC device RO performance.

The embodiments of the present disclosure can achieve several technical effects including increasing performance sensitivity of the SC gate and reducing the effective capacitance, thereby improving the SC device RO performance without the risk of exposing the LC fin top WF metals. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices including 14 nm FinFET devices with SC and LC devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming an interlayer dielectric (ILD) over a substrate of a fin field effect transistor (FinFET) device, the ILD having a short channel (SC) region and a long channel (LC) region;
    forming a SC gate and a LC gate within the SC and LC regions, respectively, an upper surface of the SC and LC gates being substantially coplanar with an upper surface of the ILD;
    forming a lithography stack over the LC region;
    recessing SC region of the ILD and the SC gate at the same time;
    stripping the lithography stack;
    planarizing the ILD between the recessed SC region and the LC region to smooth an edge portion of the ILD between the SC region and the LC region;
    forming a silicon nitride (SiN) cap layer over the SC and LC regions after planarizing the ILD;
    forming a tetraethyl orthosilicate (TEOS) layer over the SiN cap layer; and
    planarizing the TEOS layer.

2. The method according to claim 1, comprising forming the ILD of high density plasma (HDP) oxide and low-k spacers.

3. The method according to claim 1, comprising forming the SC and LC gates by:
    forming a SC trench and a LC trench down to a silicon (Si) fin in the SC and LC regions of the ILD, respectively;
    forming a conformal dielectric layer in the SC and LC trenches and over the SC and LC regions;
    forming a conformal work function (WF) metal layer over the dielectric layer;
    forming a conformal barrier metal layer over the WF metal layer;
    forming a tungsten (W) layer over the barrier metal layer; and
    planarizing the W, barrier metal, WF metal, and dielectric layers down to the ILD.

4. The method according to claim 1, comprising forming the lithography stack by:
    forming a spin-on-hardmask (SOH) layer over the LC region;
    forming a silicon oxynitride (SION) layer over the SOH layer;
    forming a buried anti-reflective coating (BARC) layer over the SiON layer; and
    forming a photoresist layer over the BARC layer.

5. The method according to claim 1, comprising recessing the SC gate by:
    etching the SC gate selectively to a depth of 8 nanometer (nm) to 10 nm with a dry etchant, forming a cavity.

6. The method according to claim 5, comprising forming the SiN cap layer on side and bottom surfaces of the cavity.

7. The method according to claim 1, comprising recessing the SC region of ILD by:
    etching the SC region to a depth of 8 nm to 10 nm with a dry etchant.

8. The method according to claim 1, further comprising cleaning the SC and LC regions subsequent to the stripping and prior to the forming of the SiN cap layer.

9. The method according to claim 1, comprising forming the SiN cap layer to a thickness of 40 angstrom (Å) to 60 Å.

* * * * *